United States Patent [19]

Okajima et al.

[11] Patent Number: 4,675,555

[45] Date of Patent: Jun. 23, 1987

[54] IC INPUT BUFFER EMITTER FOLLOWER WITH CURRENT SOURCE VALUE DEPENDENT UPON CONNECTION LENGTH FOR EQUALIZING SIGNAL DELAY

[75] Inventors: Yoshinori Okajima; Masaki Ohiwa, both of Kawasaki, Japan

[73] Assignees: Fujitsu Limited, Kawasaki; Fujitsu VLSI Limited, Kasugai, both of Japan

[21] Appl. No.: 813,941

[22] Filed: Dec. 27, 1985

[30] Foreign Application Priority Data

Dec. 28, 1984 [JP] Japan ................................ 59-274560

[51] Int. Cl.⁴ .......................................... H03K 19/013
[52] U.S. Cl. ................................ 307/455; 307/200 A; 307/443; 307/475; 307/591; 307/296 R; 307/303
[58] Field of Search ................... 307/200 A, 443, 455, 307/475, 491, 246, 270, 591, 592, 603, 605, 296 R, 297, 303

[56] References Cited

U.S. PATENT DOCUMENTS

| 3,573,489 | 4/1971 | Sramek | 307/455 |
| 3,860,836 | 1/1975 | Pedersen | 307/455 X |
| 4,347,446 | 8/1982 | Price | 307/443 |
| 4,359,653 | 11/1982 | Takamasa | 307/443 X |
| 4,435,654 | 3/1984 | Koide | 307/455 |
| 4,593,211 | 6/1986 | Belforte | 307/443 X |

Primary Examiner—Stanley D. Miller
Assistant Examiner—D. R. Hudspeth
Attorney, Agent, or Firm—Staas & Halsey

[57] ABSTRACT

In a semiconductor device including a plurality of input signal pads ($P_0, \ldots, P_7$); a plurality of emitter followers ($Q_{01}, \ldots, Q_{71}$) are connected to the input signal pads ($P_0, \ldots, P_7$); a plurality of input signal buffers ($BUF_0, \ldots, BUF_7$) are connected to the emitter followers ($Q_{01}, \ldots, Q_{71}$); and a plurality of constant current sources ($I_{01}, \ldots, I_{71}$) are connected to the emitter followers ($Q_{01}, \ldots, Q_{71}$). The emitter followers ($Q_{01}, \ldots, Q_{71}$) are in proximity to the input signal pads ($P_0, \ldots, P_7$), and the constant current sources ($I_0, \ldots, I_7$) are in proximity to the emitter followers ($Q_{01}, \ldots, Q_{71}$). The current values of the constant current sources ($I_{01}, \ldots, I_{71}$) are determined in accordance with the length of the corresponding connections between the emitter followers ($Q_{01}, \ldots, Q_{71}$) and the input signal buffers ($BUF_0, \ldots, BUF_7$).

7 Claims, 12 Drawing Figures

IC INPUT BUFFER EMITTER FOLLOWER WITH CURRENT SOURCE VALUE DEPENDENT UPON CONNECTION LENGTH FOR EQUALIZING SIGNAL DELAY

BACKGROUND OF THE INVENTION

1. Field of the Invention

The present invention relates to a semiconductor device, and more particularly, to the improvement of a signal input portion of an emitter-coupled logic (ECL) integrated circuit.

2 Description of the Related Art

The chip area of an advanced ECL integrated circuit is often increased, and therefore, some connection lines between a plurality of input signal pads and a plurality of input signal buffers such as address buffers become long. Consequently, if the distance between an input signal pad and an emitter follower transistor used as a signal input portion is large, for example, the input capacitance of an input signal is increased due to the parasitic capacitance of a long connection therebetween, thus increasing the access time.

To avoid this, in the prior art only the emitter follower transistor of the signal input portion is in proximity to the input signal pad, while a current source of the signal input portion is left on the circuit side of the input signal buffer, thereby reducing the input capacitance for an input signal. In this case, however, if the current flowing through the emitter follower is increased, the potential fall due to the resistance of signal paths is large so that the post input stage circuits may not operate normally. Contrary to this, if the current flowing through the emitter follower is decreased, the propagation speed of the input signal level becomes large due to the parasitic capacitance, thereby reducing the access time. Thus, in this case, it is impossible to satisfy the two conditions regarding the potential fall and the propagation speed of the signal level.

SUMMARY OF THE INVENTION

An object of the present invention is to minimize the potential fall of signal level due to the resistance of the signal path in a long connection line, and to minimize the delay in the access time.

According to the present invention, a constant current source is provided in proximity to the emitter follower and is connected thereto, and a current value of the constant current source is changed in accordance with connection line length, i.e., the parasitic capacitance between the emitter follower and the input signal buffer. That is, the larger the connection line length, the greater the current value of the constant current source.

Thus, since the current flowing through the connection line between the emitter follower and the input signal buffer is greatly reduced, reduction in potential due to the connection resistance is reduced, i.e., the reduction of a signal level is lessened. Also, since the current value of the constant current source is increased when the parasitic capacitance is large, the delay in the fall of the signal level is reduced.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
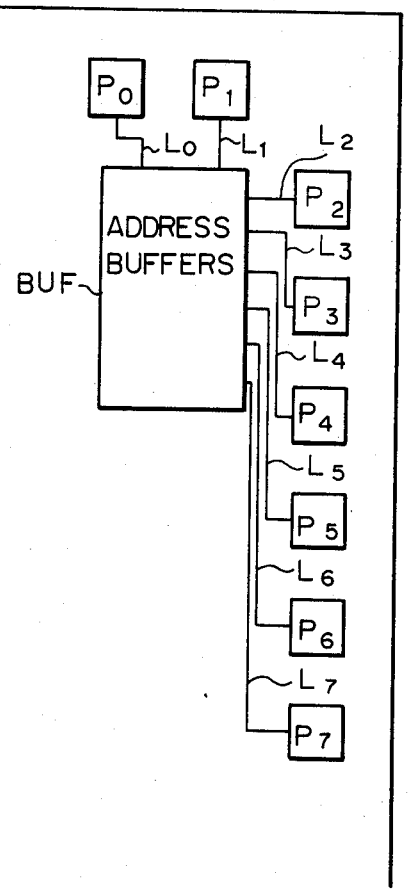
FIG. 1 is a partial layout diagram of a general semiconductor device.

In FIG. 1, which illustrates a general semiconductor device such as an ECL memory device, a plurality of pads $P_1$ through $P_7$ are connected via connection lines or conductor $L_0$ through $L_7$ to a signal input portion such as address buffers BUF. As the integration of the device is advanced or increased to reduce the size of the address buffers BUF, some of the connection lines $L_0$ through $L_7$ become long. For example, in FIG. 1, the connection line $L_0$ between the pad $P_0$ and the address buffers BUF is relatively short, but the connection line $L_7$ between the pad $P_7$ and the address buffers BUF is very long. Note that the signal input portion includes emitter followers, diodes, current sources, and the like, other than the address buffers BUF.

The device of FIG. 1 will be explained in detail with reference to FIGS. 2 and 3.

Figure 2:
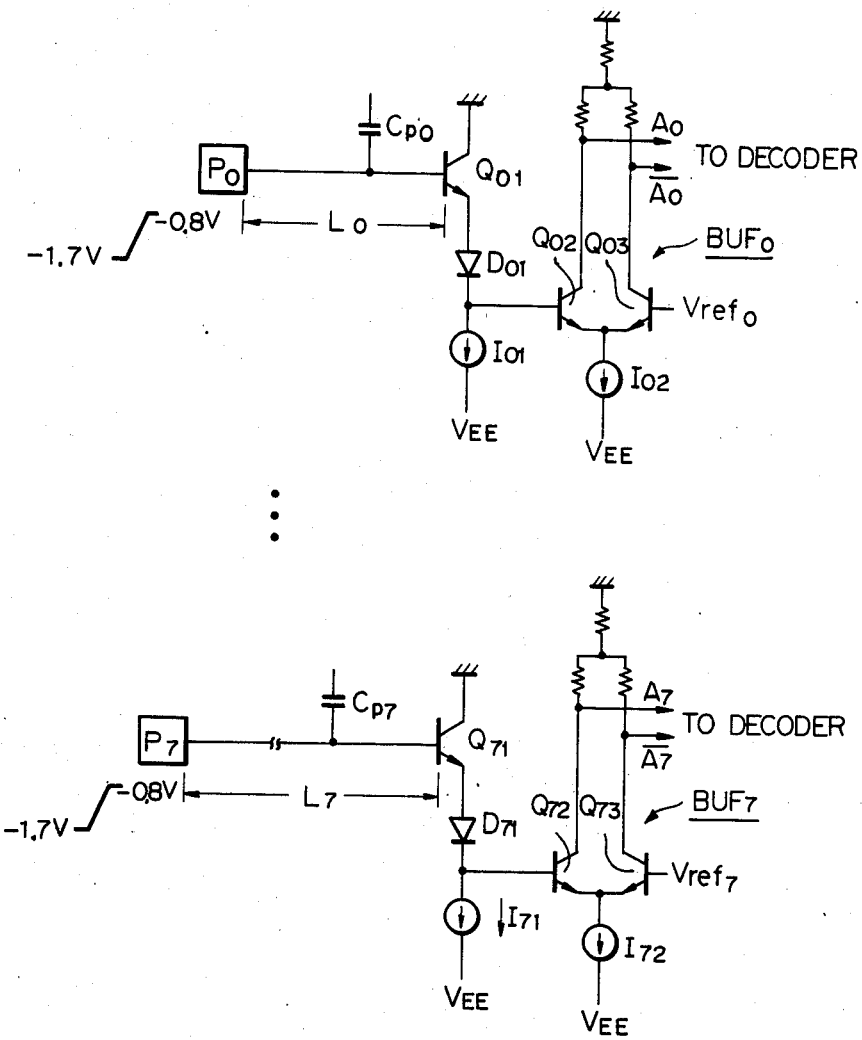
FIGS. 2 and 3 are circuit diagrams showing prior art semiconductor devices.

In FIG. 2, emitter followers $Q_{01}, \ldots,$ and $Q_{71}$, diodes $D_{01}, \ldots,$ and $D_{71}$, and constant current sources $I_{01}, \ldots,$ and $I_{71}$ are linked between the pads $P_0, \ldots,$ and $P_7$, and the address buffers $BUF_0, \ldots,$ and $BUF_7$. Each of the address buffers $BUF_0, \ldots,$ and $BUF_7$ has the same configuration. For example, the address buffer $BUF_0$ comprises two transistors $Q_{02}$ and $Q_{03}$, and a constant current source $I_{02}$, to form a current switch. Note that the diode $D_{01}$ serves as a level shift means so that the center of the input amplitude of a signal applied to the base of the transistor $Q_{02}$ conforms to a reference potential $V_{ref0}$ applied to the base of the transistor $Q_{03}$, thereby improving the operation speed of the address buffers. For example, if the center of the input amplitude of the signal applied to the base of the transistor $Q_{02}$ is too high as compared with the reference potential $V_{ref0}$, i.e., if the high level of the signal applied to the base of the transistor $Q_{02}$ is too high as compared with the reference potential $V_{ref0}$, the change of the output signal $A_0$ from high to low is delayed as compared with the change of the output signal $A_0$ from low to high. This delay is reduced by the diode $D_0$. However, note that the number of such diode stages may be increased or decreased as occasion demands. Also, $V_{EE}$ designates a power supply voltage such as $-5$ V.

In FIG. 2, the distance between the pad $P_1$ and the emitter follower $Q_{01}$ is relatively small, and accordingly, the input capacitance encountered by an address signal applied to the pad $P_1$ is small due to the parasitic capacitance $C_{p0}$ of the short connection line $L_0$, thus reducing the access time. On the other hand, the distance between the pad $P_7$ and the emitter follower $Q_{171}$ is relatively long, and accordingly, the input capacitance of an address signal applied to the pad $P_7$ is large due to the parasitic capacitance $C_{P7}$ of the long connection line $L_7$, thus increasing the access time.

Figure 3:
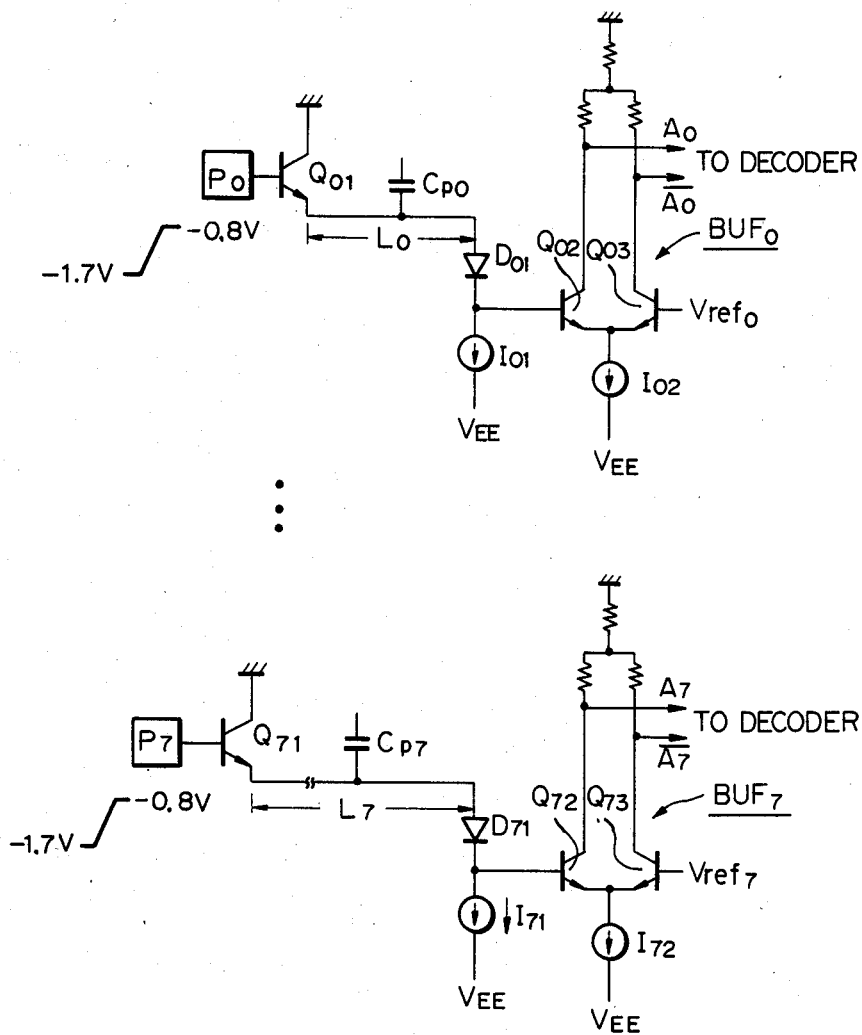

In order to reduce the input capacitance for an address signal, in FIG. 3, the emitter followers $Q_{01}, \ldots,$ and $Q_{71}$ are provided in proximity to the pads $P_0, \ldots,$ and $P_7$, respectively, and are connected thereto. That is, in this case, the input capacitance at the post input stage of each of the pads $P_0, \ldots,$ and $P_7$ is reduced by $1/\beta$ ($\beta$ represents the current amplification factor of the emitter follower such as $Q_{01}$)

Figure 4:
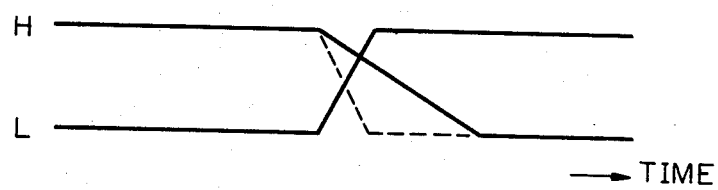
FIG. 4 is a timing diagram showing the operation of the circuit of FIG. 3.

In FIG. 3, however, when the emitter current of the emitter follower $Q_{71}$, i.e., the current $I_{71}$ is increased, the reduction in potential due to the resistance of the connection line $L_7$ is large since the connection $L_7$ is long, and as a result, the signal level is greatly reduced so that the post-stage circuit which, in this case, is the address buffer $BUF_7$ does not operate normally. Contrary to this, when the emitter current $I_{71}$ of the emitter follower $Q_{71}$ is small, the fall at the signal level is slow due to the parasitic capacitance $C_{P7}$ as shown in FIG. 4, thereby increasing the access time.

Figure 5:
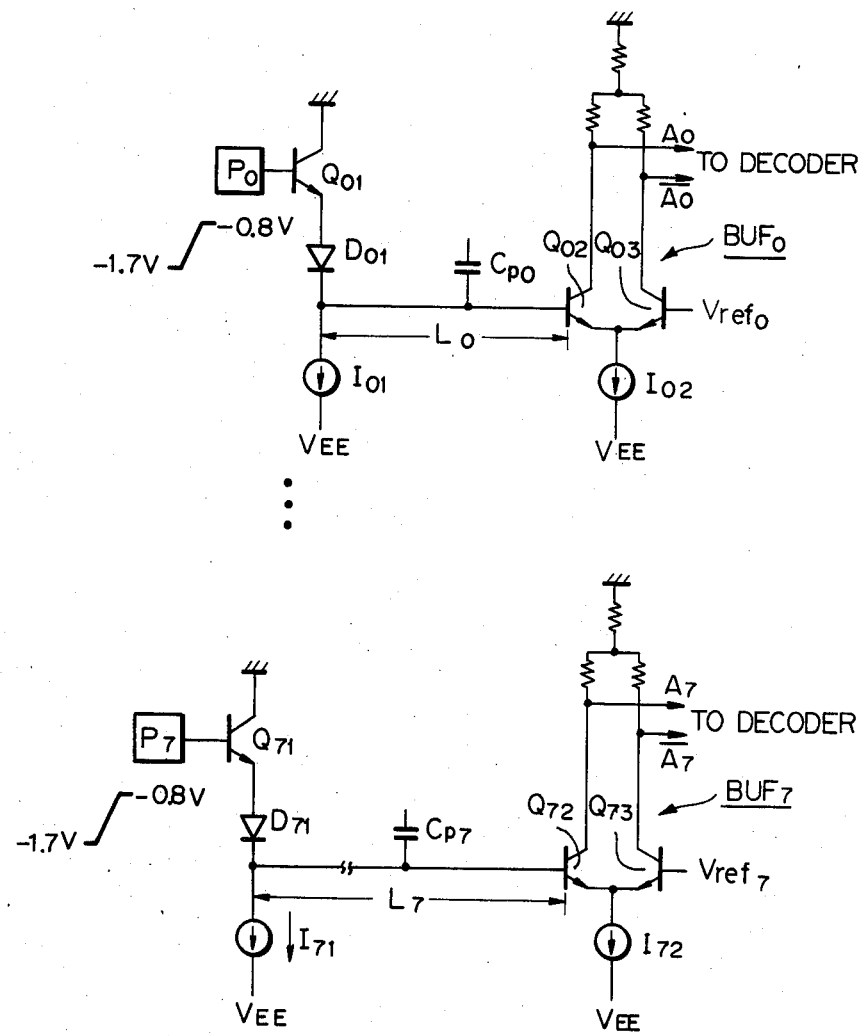
FIG. 5 is a circuit diagram illustrating an embodiment of the semiconductor device according to the present invention.

In FIG. 5, which illustrates an embodiment of the semiconductor device according to the present invention, the constant current sources $I_{01}$ through $I_{71}$ are provided in proximity to the emitter followers $Q_{01}$ through $Q_{71}$, respectively. As a result, since a current required for driving the address buffer such as $BUF_0, \ldots,$ and $BUF_7$ is small, the current values of the constant current sources can be reduced even when the length of the connections lines $L_0$ through $L_7$ is large. Even in this case, however, the access time is dependent upon the length of the connection lines $L_0$ through $L_7$ which should be charged or discharged. Therefore, the current values of the constant current sources $I_{01}$ through $I_{71}$ are determined in accordance with the length of the connection lines $L_0$ through $L_7$, i.e., the parasitic capacitances $C_{P0}$ through $C_{P7}$, respectively. That is, the ability of the emitter followers $Q_{01}$ through $Q_{71}$ to charge the lines are changed in accordance with the parasitic capacitances $C_{P0}$ through $C_{P7}$. For example, when the length of the connection line such as $L_0$ is small, the current value of the constant current source $I_{01}$ is small, and when the length of the connection line such as $L_7$ is large, the constant current source $I_{07}$ is large.

Figure 6A:
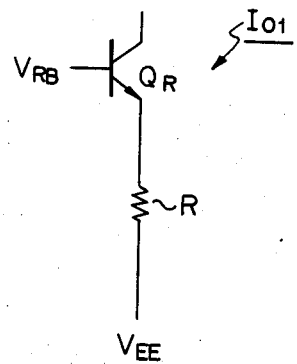
FIGS. 6A and 6B are circuit diagrams of the constant current sources $I_{il}$ of FIG. 5.
Figure 6B:
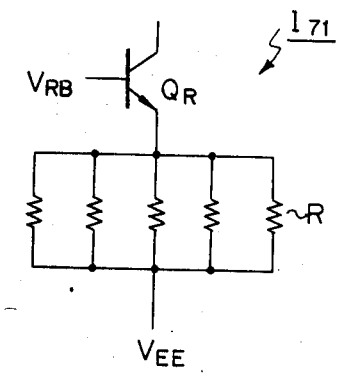
Figure 7A:
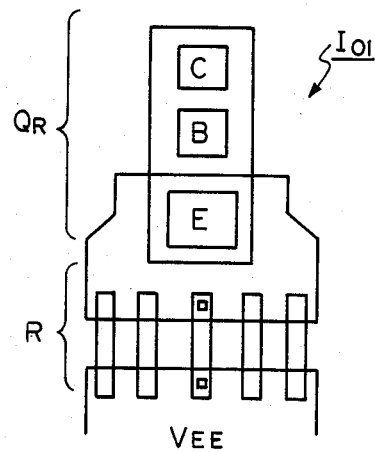
FIGS. 7A, 7B, 8A and 8B are layout diagrams of FIGS. 6A and 6B.
Figure 7B:
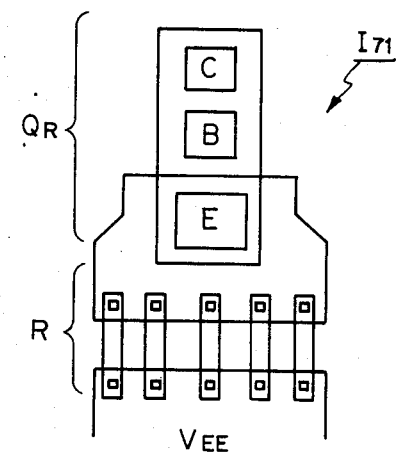
Figure 8A:
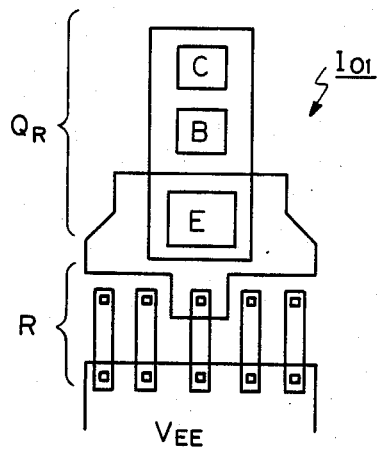
Figure 8B:
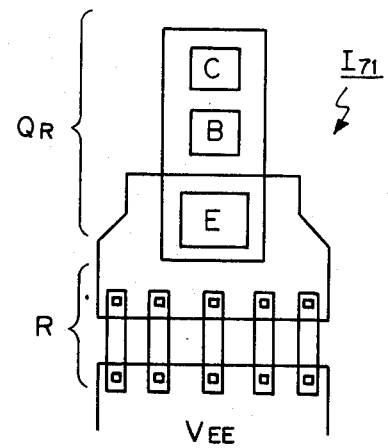

As shown in FIG. 6A, the constant current source $I_{01}$ is comprised of a transistor $Q_R$ having a base to which a definite voltage $V_{RB}$ is applied, and a resistor R. Also, as shown in FIG. 6B, the constant current source $I_{71}$ is comprised of a transistor $Q_R$ having a base to which the definite voltage $V_{RB}$ is applied, and five resistors R. That is, the current value of the constant current source is determined in accordance with the number of resistors R. For example, as shown in FIGS. 7A and 7B, the number of resistors R is substantially determined by the number to contacts of the resistors R. Also, as shown in FIGS. 8A and 8B, the number of resistors R can be determined by changing the connection pattern of the transistor $Q_{IR}$ and the resistors R.

In FIG. 5, the current values of the constant current sources $I_{01}$ through $I_{71}$ are changed in accordance with the parasitic capacitances $C_{P0}$ through $C_{P7}$, respectively. This change of the current values of the constant current sources slightly affects the base-emitter voltage $V_{BE}$ of the emitter followers $Q_{01}$ through $Q_{71}$. As a result, the high and low levels of an address signal at the base of the transistor $Q_{02}$ (or $Q_{72}$) are slightly changed, and accordingly, the center of the amplitude of the address signal at the base of the transistor $Q_{02}$ (or $Q_{72}$) is shifted from the reference potential $V_{ref0}$ (or $V_{ref7}$).

Figure 9:
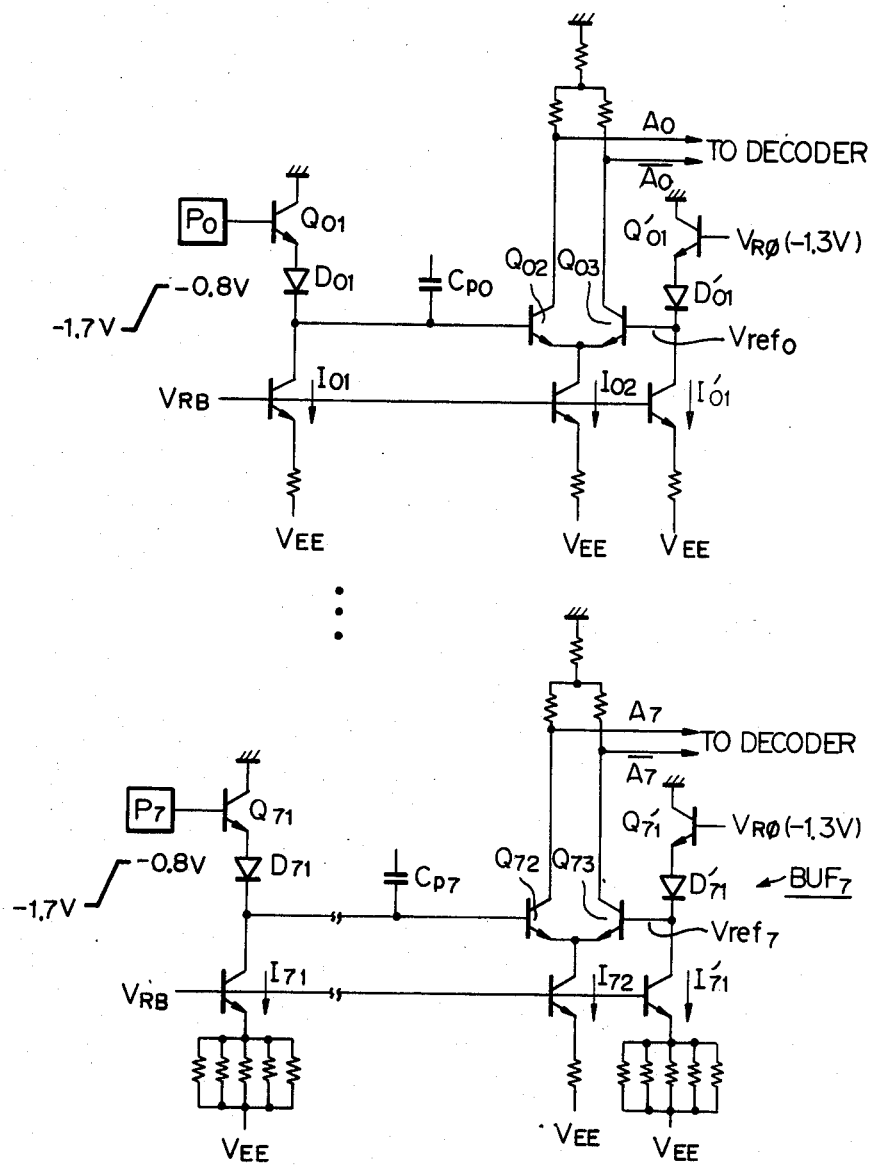
FIG. 9 is a circuit diagram illustrating a second embodiment of the semiconductor device according to the present invention.

In FIG. 9, which illustrates another embodiment of the semiconductor device according to the present invention, the reference potential such as $V_{ref0}$ is changed in accordance with the current value of the constant current source such as $I_{01}$, so that the center of the amplitude of the address signal at the base of the transistor such as $Q_{02}$ conforms to the reference potential such as $V_{ref0}$, thereby improving the operation of the address buffers. For this purpose, the circuits on the circuit side of reference potential $V_{ref0}$ through $V_{ref7}$ have the same configuration as the circuits on the circuit side of the address signals. That is, transistors $Q_{01}'$ through $Q_{71}'$, diodes $D_{01}'$ through $D_{71}'$, and constant current sources $I_0'$ through $I_{71}'$ corresponding to the transistors $Q_{01}$ through $Q_{71}$, the diodes $D_{01}$ through $D_{71}$ and the constant current sources $I_{01}$ through $I_{71}$ are provided for the reference potentials $V_{ref0}$ through $V_{ref7}$. Also, a reference potential $V_{R\phi}$ ($-1.3$ V) is applied to the bases of the emitter followers $Q_{01}$, through $Q_{71}'$. Herem it is important that the current value of the constant current source such as $I_{01}'$ on the circuit side of the reference potential be the same as the current value of the corresponding constant current source $I_{01}$ on the address signal circuit side. Thus, the fluctuation in the base-emitter voltage $V_{BE}$ of each of the emitter followers $Q_{01}$ through $Q_{71}$ is the same as the fluctuation in the base-emitter voltage $V_{BE}$ of each of the emitter followers $Q_{01}'$ through $Q_{71}'$, and as a result, the fluctuation in the comparison operation between the base potential of the transistor such as $Q_{02}$ and the base potential of the transistor such as $Q_{03}$ is eliminated.

Also, in FIG. 9, the number of diode stages such as $D_{01}', \ldots,$ and $D_{71}'$ is increased or decreased as occasion demands.

Note that, in the above-mentioned embodiments, an address signal is used as an input signal. However, the present invention can be applied to various signals (external clock signals) other than address signals.

As explained above, according to the present invention, the reduction in signal level due to the long connection line can be avoided, and in addition, the reduction in access time can be avoided.

We claim:

1. A semiconductor device, comprising:
   a plurality of input signal pads;
   a plurality of emitter follower transistors for receiving input signals, each provided in proximity to one of said input signal pads and connected thereto, and having an output;
   a plurality of input signal buffers;
   a plurality of connection lines each linked between the output of one of said emitter follower transistors and one of said input signal buffers and each having a length; and
   a plurality of constant current sources, each provided in proximity to one of said emitter foller transistors and connected thereto, the current values provided by said constant current sources being determined in accordance with the length of the corresponding connection lines, so that the current values of said constant current sources become larger as the corresponding connection lines become longer.

2. A device as set forth in claim 1, further comprising comparison reference potential adjusting means for adjsuting comparison reference potentials applied to said input signal buffers in accordance with the current values provided by said constant current sources, thereby substantially setting the center of the amplitude of signals applied to said input signal buffers at the corresponding comparison reference potentials, said input signal buffers comprising gates having threshold voltages determined by the corresponding comparison reference potentials.

3. A device as set forth in claim 2, wherein said comparison reference potential adjusting means comprises:
a plurality of reference emitter follower transistors, connected to corresponding input signal buffers, for receiving a reference potential; and
a plurality of reference constant current sources, each connected to corresponding reference emitter follower transistors and having the same current value as the corresponding one of said constant current sources.

4. A device as set forth in claim 1, further comprising a plurality of level shift means coupled between corresponding said emitter follower transistors and said constant current sources.

5. A device as set forth in claim 3, wherein each of said constant current sources comprises:
a source transistor, connected to corresponding emitter follower transistor, for receiving a reference potential; and
a plurality of resistors in parallel, connected to said source transistor, the number of said resistors determining the current value of said constant current sources.

6. A semiconductor device, comprising:
input signal buffers;
conductors of different lengths connected to corresponding input signal buffers and each conductor having a buffer end and an input pad end;
input pads;
current supply means, connected between respective input pads and conductors, for providing current to said conductors in dependence on length, each current supply means comprising:
an emitter follower transistor connected between a corresponding input pad and the input pad end of a corresponding conductor; and
a constant current source connected to the input pad end of the corresponding conductor and providing current with a magnitude in dependence on conductor length.

7. A device as set forth in claim 6, wherein said constant current source comprises:
a source transistor connected to the input pad end of said conductor;
a resistor connected to said source transistor having a resistance dependent on conductor length.

* * * * *

UNITED STATES PATENT AND TRADEMARK OFFICE
CERTIFICATE OF CORRECTION

PATENT NO. : 4,675,555

DATED : June 23, 1987

INVENTOR(S) : Yoshinori Okajima and Masaki Ohiwa

It is certified that error appears in the above-identified patent and that said Letters Patent is hereby corrected as shown below:

Col. 3, line 39, "Q01" s/b --$Q_{01}$--;

Col. 4, line 21, "$Q_{01}$," s/b --$Q_{01}'$--;

Col. 4, line 21, "Herem" s/b -- Here, --.

Col. 4, line 58, "foller" s/b --Follower--;

Col. 4, line 67, "adjsuting" s/b -- adjusting --.

Signed and Sealed this

Fifth Day of January, 1988

Attest:

DONALD J. QUIGG

Attesting Officer

Commissioner of Patents and Trademarks